United States Patent
Mathur et al.

(10) Patent No.: US 7,190,191 B1
(45) Date of Patent: Mar. 13, 2007

(54) OVER-VOLTAGE TOLERANT INPUT BUFFER HAVING HOT-PLUG CAPABILITY

(75) Inventors: Manish Kumar Mathur, Bangalore (IN); Gajender Rohilla, Bangalore (IN)

(73) Assignee: Cypress Semiconductor Corporation, San Jose, CA (US)

( * ) Notice: Subject to any disclaimer, the term of this patent is extended or adjusted under 35 U.S.C. 154(b) by 8 days.

(21) Appl. No.: 10/786,204

(22) Filed: Feb. 24, 2004

Related U.S. Application Data

(60) Provisional application No. 60/449,659, filed on Feb. 24, 2003.

(51) Int. Cl.
*H03K 19/94* (2006.01)
*G06F 13/00* (2006.01)

(52) U.S. Cl. ............................ 326/68; 326/83; 710/302
(58) Field of Classification Search ................. 326/68; 710/302
See application file for complete search history.

(56) References Cited

U.S. PATENT DOCUMENTS

| | | | |
|---|---|---|---|
| 5,485,107 A * | 1/1996 | Lacey et al. ................. 326/86 |
| 5,872,464 A | 2/1999 | Gradinariu |
| 6,023,176 A | 2/2000 | Chester |
| 6,191,636 B1 | 2/2001 | Cress et al. |
| 6,236,235 B1 * | 5/2001 | Arai et al. ..................... 326/81 |
| 6,323,701 B1 | 11/2001 | Gradinariu et al. |
| 6,346,827 B1 * | 2/2002 | Yeung et al. ................. 326/41 |
| 6,411,150 B1 | 6/2002 | Williams |
| 6,784,700 B1 | 8/2004 | Hunt et al. |
| 6,784,717 B1 | 8/2004 | Hunt et al. |
| 6,842,320 B1 * | 1/2005 | Mathur et al. ............. 361/91.1 |

* cited by examiner

*Primary Examiner*—James H. Cho
(74) *Attorney, Agent, or Firm*—Brownstein Hyatt Farber Schreck, P.C.

(57) ABSTRACT

An input buffer circuit and associated method operable in a normal mode and a hot-plug mode. In one example, the input buffer has an input and a buffer output, and the input buffer may include a pull-up path coupled between a first circuit supply and the buffer output; a pull-down path coupled between the buffer output and a ground reference voltage; a first transistor coupled between the input and the pull-up path to activate the pull-up path; a second transistor coupled between the input and the pull-down path to activate the pull-down path; and a third transistor for protecting the pull-up path from over-voltage. The input buffer circuit may be configured to prevent an over-voltage condition on each of the plurality of transistors and the input buffer circuit may be configured to allow a hot-plug operation.

7 Claims, 3 Drawing Sheets

OVER-VOLTAGE TOLERANT INPUT BUFFER HAVING HOT-PLUG CAPABILITY

CROSS REFERENCE TO RELATED APPLICATION

This application claims the benefit under 35 U.S.C. § 119(e) to U.S. Provisional Application No. 60/449,659 entitled "OVER-VOLTAGE TOLERANT INPUT BUFFER HAVING HOT-PLUG CAPABILITY," filed Feb. 24, 2003, the disclosure of which is hereby incorporated by reference in its entirety.

TECHNICAL FIELD

The present invention relates generally to integrated circuit (IC) input/output (I/O) buffers and, more particularly, to input buffers having over-voltage tolerance and hot-plug capability.

BACKGROUND OF THE INVENTION

In systems, such as communication systems, circuit cards are often required to be replaced without impacting the normal system functionality. Typically, such cards are replaced while the other parts of system continue to receive their full power supply. Because of this requirement, input/output (I/O) pads of integrated circuits or chips included on these cards can have a signal on their pads even when these chips are not receiving their own power supply. This situation is commonly referred to as a "hot-plug" where the chip would be referred to as "hot-pluggable." For this capability, the chip input receivers (i.e., buffers) must have hot-plug capability. In internal circuit protection terms, the critical current paths should be switched off to accommodate the "live insertion" of a chip into a system where the chip power supply is not yet at its full level, but where a signal may be present at a chip pad.

Because chip technologies are improving by shrinking dimensions to allow for continued performance enhancements, board power supplies typically remain at least one generation behind. Thus, the I/Os inside the chips may be driven using a higher power supply, so both input and output may also see the higher supply voltage. As recognized by the present inventors, such I/Os may need to be protected from supply "over-voltage" conditions where the I/O is essentially supplied by a higher voltage level than the fabrication or core technology used to implement the transistors in the I/O circuitry. Over-voltage protection, in circuit implementation terms, includes, for example, situations where the VGS (transistor gate-to-source voltage), VDS (transistor drain-to-source voltage), and VGD (transistor gate-to-drain voltage) differences across any associated transistor should not be allowed to face more than a designated value, such as 2.75 volts for a given transistor technology. If each such transistor is protected, then the I/O circuit as a whole can be protected.

A conventional approach to implement the hot-plug capability is shown in circuit 20 of FIG. 1. There are two basic modes of operation: a "live insertion" mode (e.g., the "hot plug" situation) and a "normal" mode. In the live insertion mode, the NGATE node 22 is at a voltage level of about PAD-2Vt (i.e., about two transistor threshold voltages below the voltage level applied to the PAD node 24) and the PGATE node 26 is essentially the same voltage level as the NGATE 22. Thus, virtually no current path exists through transistor MP1. In the live insertion mode, the circuit 20 may tolerate up to about 3.6 volts at the PAD 24. In the normal mode of operation, the PGATE node 26 will be about 2Vt (i.e., about two transistor threshold voltages) above the ground level, this will turn on transistor MP1, and NGATE 22 will be around the VDD level. Thus, the PAD signal 24 will be substantially passed to the core 28 by transistor MN1.

This conventional approach of FIG. 1 has two main disadvantages. First, this circuit 20 cannot take care of over-voltage if the chip power supply is greater than the technology supports, so there is no effective over-voltage protection. For example, if VDD is about 3.6 volts in normal operating conditions and PAD 24 is about 0 volts, MN1 is subjected to an over-voltage condition. Second, the signal passed to the core does not provide a rail-to-rail output and this adversely affects the Vih (minimum input level detectable as a logic high) and Vil (maximum input level detectable as a logic low) levels.

As recognized by the present inventors, what is needed is an input buffer having over-voltage tolerance and hot-plug capability, and if desired, also providing a full rail-to-rail output to the associated chip core. It is against this background that embodiments of the present invention have been developed.

SUMMARY

According to an embodiment of the present invention, an input buffer having over-voltage tolerance based on the chip power supply level is provided, and the input buffer has a hot-plug capability.

According to one broad aspect of another embodiment of the present invention, disclosed herein is an integrated circuit including at least one pad receiving at least one input signal, a core, and at least one input buffer circuit coupled between the pad and the core, the input buffer having a first mode where the input buffer circuit operates as an inverter, and a second mode wherein the input buffer circuit limits the voltage levels within the input buffer. In one embodiment, the first mode includes a normal mode where a supply voltage is applied to the input buffer circuit, and the second mode includes a live-insertion mode where a supply voltage is not applied to the input buffer circuit and an input signal is applied to the at least one pad.

According to one broad aspect of another embodiment of the present invention, disclosed herein is a method of operating an input buffer. In one example, the method includes configuring the input buffer to operate substantially as an inverter in a normal mode and configuring the input buffer to operate substantially to limit internal voltage levels in a live insertion mode.

According to one broad aspect of another embodiment of the present invention, disclosed herein is an input buffer circuit having an input (i.e., PAD in FIG. 2) and a buffer output (i.e., INPUT TO CORE), the input buffer operable in a normal mode and a hot-plug mode. In one example, the input buffer may include a pull-up path coupled between a first circuit supply (i.e., VDD) and the buffer output, and a pull-down path coupled between the buffer output and a ground reference voltage; a first transistor (i.e., MP3) coupled between the input and the pull-up path to activate the pull-up path; a second transistor (i.e., MN3) coupled between the input and the pull-down path to activate the pull-down path; and a third transistor (i.e., MN4) for protecting the pull-up path from over-voltage.

In one example, the input buffer circuit is configured to prevent an over-voltage condition on each of the plurality of transistors and the input buffer circuit is configured to allow a hot-plug operation. In another embodiment, the pull-up path may include a first reference voltage (i.e., V_10) and a first pair of transistors including a first and second pull-up transistor (i.e., MP1 and MP2) coupled in series, the first pull-up transistor (i.e., MP1) having a gate coupled with the first transistor (i.e., MP3) and the gate biased by the third transistor (i.e., MN4) and the second pull-up transistor (i.e., MP2) having a gate biased by the first reference voltage (i.e., V_10 which may be approximately 1.0 volts in one example).

In another embodiment, the pull-down path may include a second reference voltage (i.e., V_25) and a second pair of transistors including a first and second pull-down transistor (i.e., MN1 and MN2) coupled in series, the first pull-down transistor (i.e., MN2) having a gate coupled with the second transistor (i.e., MN3) and the second pull-down transistor (i.e., MN1) having a gate biased by the second reference voltage (i.e., V_25 which may be approximately 2.5 volts in one example).

In one embodiment, the input buffer circuit may also include a first bias voltage (i.e., PAD_PGATE) for biasing the first transistor (i.e., MP3) and a second bias voltage (i.e., NGATE) for biasing the second transistor (i.e., MN3). In one example, the first bias voltage is approximately 1.0 volts during the normal mode and is approximately the input minus two diode drops during the hot-plug mode. In another example, the second bias voltage is approximately 2.5 volts during the normal mode and is approximately the input minus two diode drops during the hot-plug mode.

According to another aspect of the embodiment, the input buffer provides a full rail-to-rail output level range from the buffer.

The features, utilities and advantages of the various embodiments of the invention will be apparent from the following more particular description of embodiments of the invention as illustrated in the accompanying drawings.

DETAILED DESCRIPTION

Disclosed herein is a circuit which can be used as an input buffer in an integrated circuit. Embodiments of the present invention provide protection of the input buffer components (i.e., transistors) from over-voltage during normal operation as well as during hot-plug or hot-swap operations. In one example, normal operations include when the integrated circuit receives a VDD signal, such as 3.0 to 3.6 volts, and hot-plug or hot-swap operations include when the integrated circuit does not receive a VDD signal but an input signal may still be present on an I/O pad of the integrated circuit. For instance, the hot-plug condition may arise as described above when the integrated circuit is part a circuit board that is dynamically removed from a system that is operating. Various embodiments of the present invention are described herein.

Figure 1:
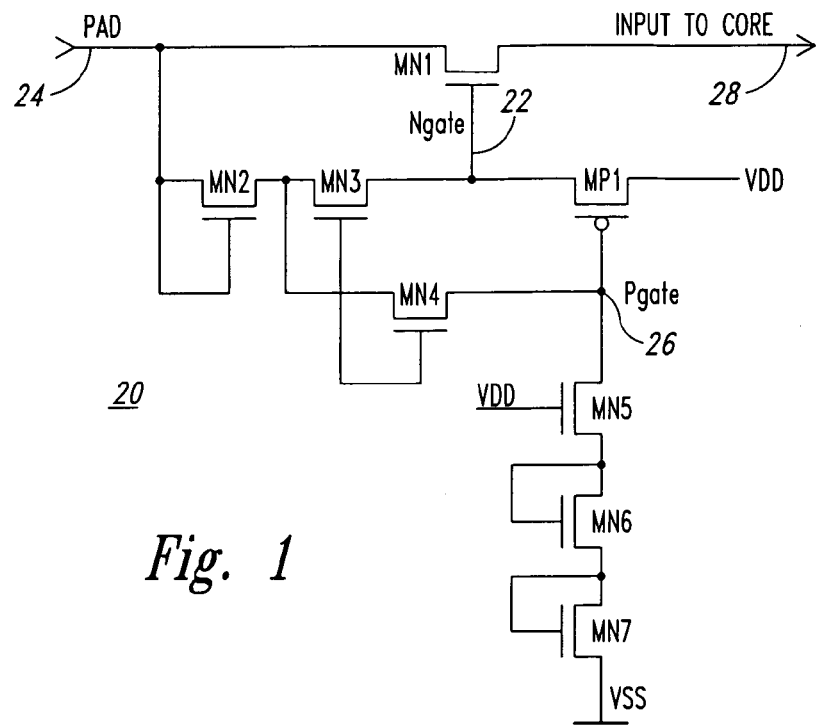
FIG. 1 is a schematic diagram of a conventional input buffer having hot-plug capability.
Figure 2:
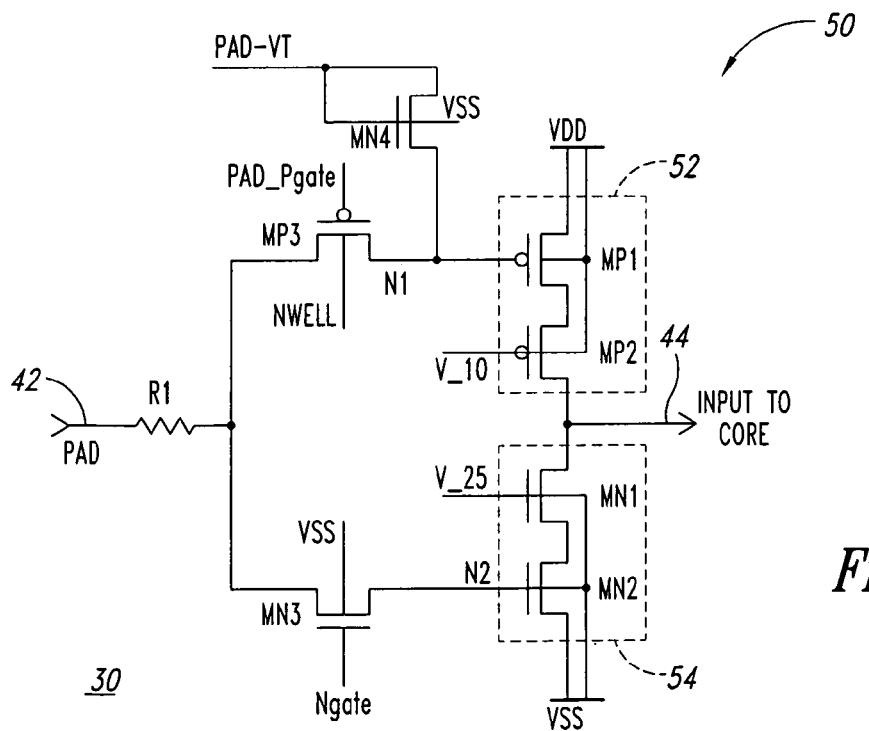
FIG. 2 is a schematic diagram of the input buffer according to an embodiment of the present invention.
Figure 3:
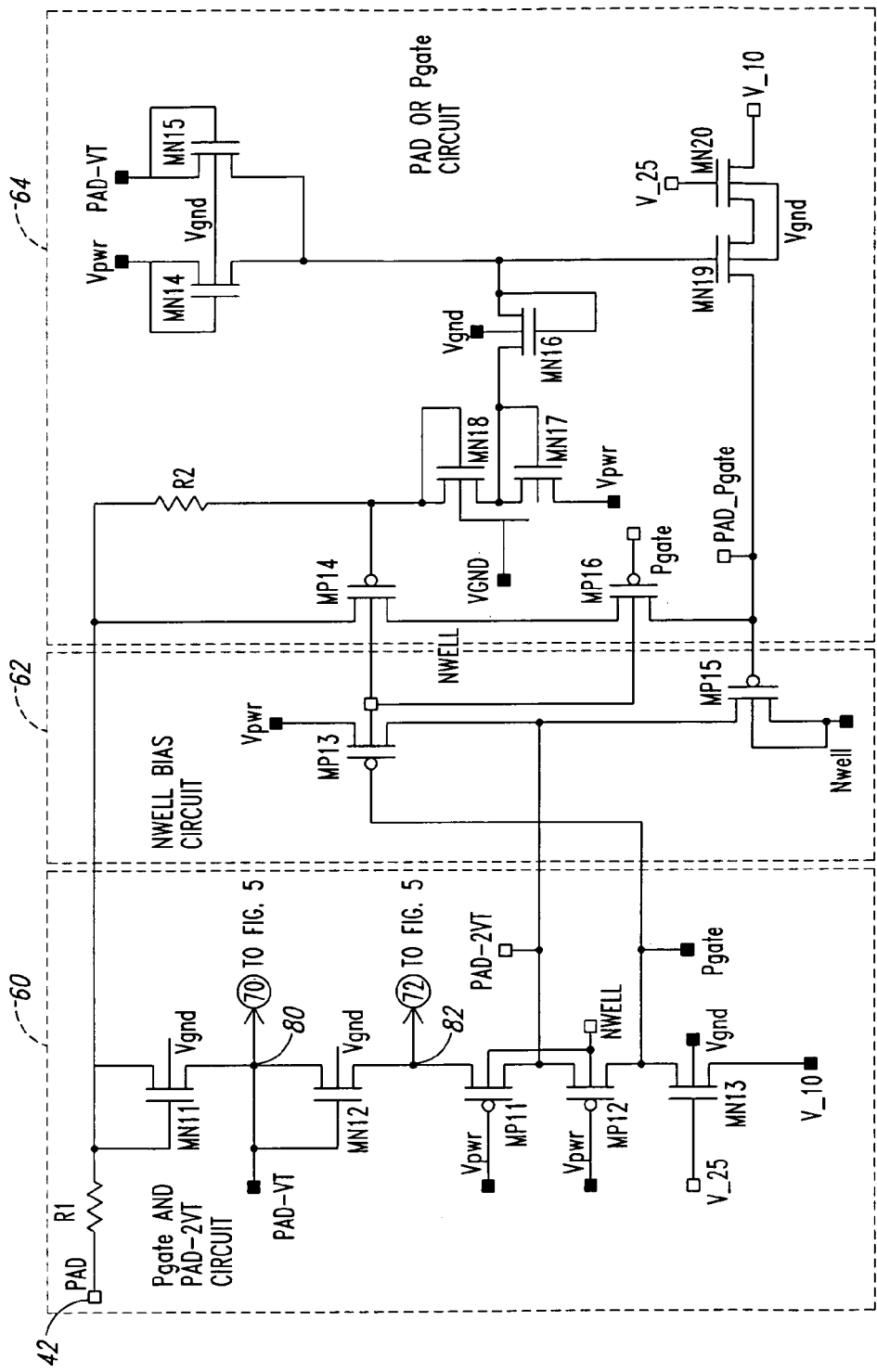
FIG. 3 is a schematic diagram of a first circuit portion for generating bias voltages that may be used for the input buffer circuit of FIG. 2.
Figure 4:
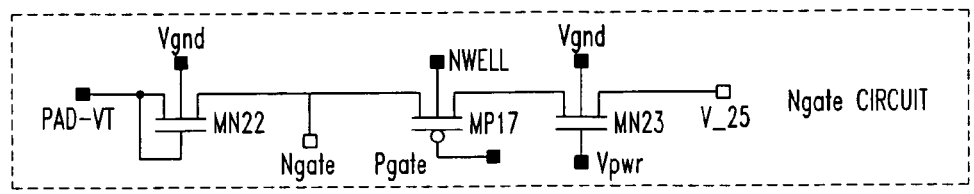
FIG. 4 is a schematic diagram of a second circuit portion for generating bias voltages that may be used for the input buffer circuit of FIG. 2.
Figure 5:
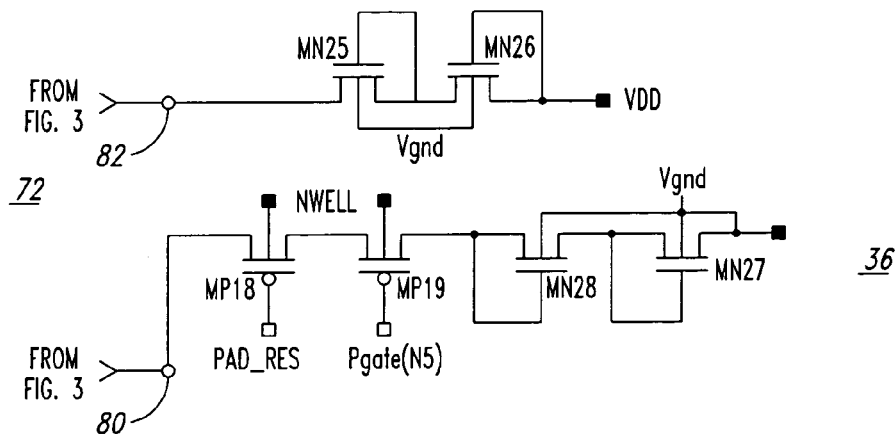
FIG. 5 is a schematic diagram of a third circuit portion for generating bias voltages that may be used for the input buffer circuit of FIG. 2.
Figure 6:
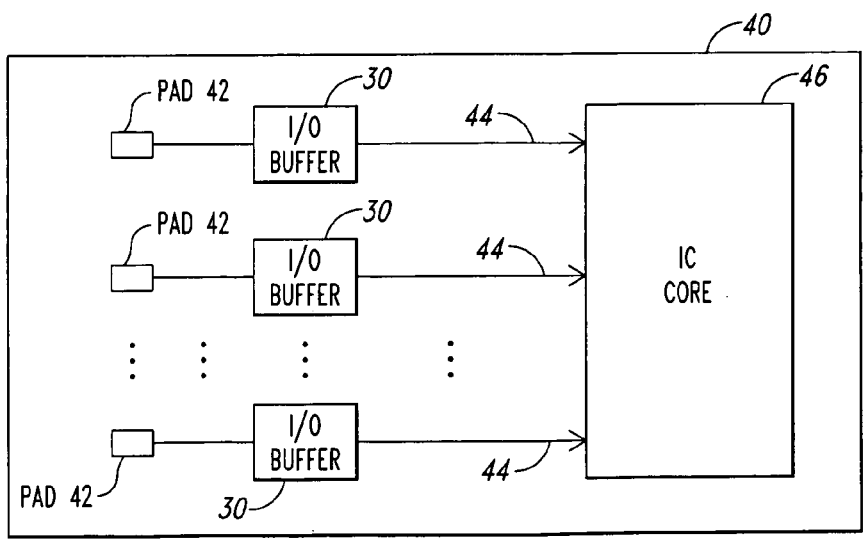
FIG. 6 illustrates one possible use of an embodiment of the present invention.

An example of a circuit 30 according to an embodiment of the present invention is illustrated in FIG. 2. FIGS. 3–5 illustrates circuits 32, 34, 36 that may be used to generate bias voltages for the circuit 30 of FIG. 2. FIG. 6 illustrates one possible use of an embodiment of the present invention, for instance, where an integrated circuit 40 has one or more PADs or I/O pins 42, and the buffer circuit 30 provides a buffer between the signal present at the PAD 42 and the corresponding INPUT TO CORE signal 44.

An embodiment of the present invention will now be described with reference to a buffer circuit 30 of FIG. 2 in conjunction with Table 1. Embodiments of the present invention provide a circuit 30 that is over-voltage tolerant in its normal working mode (i.e., when VDD is present) and in addition is over-voltage tolerant during a hot-plug mode (i.e., when VDD is not present but signals are applied to input pads 42). In one example, none of the transistors (i.e., MOSFET devices) in FIG. 2 see a voltage difference across any of the terminals of more than about 2.75 volts, for example.

As used herein, the term "transistor" or "switch" includes any switching element which can include, for example, n-channel or p-channel CMOS transistors, MOSFETs, FETs, JFETS, BJTs, or other like switching element or device. The particular type of switching element used is a matter of choice depending on the particular application of the circuit, and may be based on factors such as power consumption limits, response time, noise immunity, fabrication considerations, etc. Hence while embodiments of the present invention are described in terms of p-channel and n-channel transistors, it is understood that other switching devices can be used, or that the invention may be implemented using the complementary transistor types.

In the example of FIG. 2, the input signal PAD 42 receives the external signal into the integrated circuit, and the output signal INPUT TO CORE 44 is passed from the buffer 30 to the core 46 of the integrated circuit. In one example, the chip power supply VDD is a nominal 3.6 volts (i.e., between 3.0 to 3.6 volts, typically about 3.6 volts) with a core technology intended for a supply of about 2.75 volts, although other voltage ranges are possible depending upon the implementation.

In accordance with an embodiment of the present invention, a signal V_10 is provided which may, in one example, be approximately 1.0 volts, and a signal of V_25 is provided which may be approximately 2.5 volts. These signals can be provided using conventional power supply or regulation techniques or signal reference creation techniques, and may be derived from VDD. Further, the voltage levels of signals PAD-Vt, PAD_PGATE, NWELL, and NGATE can be provided using voltage references, supplies, or logic so that these signals are as listed in Table I, in one example.

In FIG. 2, P-channel transistors MP1 and MP2 are coupled in series with N-channel transistors and MN1 and MN2, in one example. In one embodiment, the source of P-channel transistor MP1 is coupled to VDD, the drain of transistor MP1 is coupled to the source of transistor MP2, which has its drain coupled with the drain of N-channel transistor MN1. The source of N-channel transistor MN1 is coupled with the drain of N-channel transistor MN2, which has its source coupled with VSS. The well of transistors MP1 and MP2 are coupled with VDD, while the substrate of transistors MN1 and MN2 are coupled to VSS. The gate of transistor MP1 forms node N1, while the gate of transistor MN2 forms node N2. The gates of transistors MP2 and MN1 are driven by signals V_10 and V_25, respectively, in one example.

In one embodiment, N-channel transistor MN4 has its gate and drain coupled with signal PAD-Vt, and its source coupled with node N1. The substrate of transistor MN4 is coupled with VSS. N-channel transistor MN3 has its drain coupled with the PAD signal through resistor R1 (i.e., 300–400 ohms, in one example) and its source coupled with the gate of transistor MN2 at node N2. The gate of transistor MN3 is coupled with the NGATE signal and its well is coupled with VSS, in one example.

The PAD signal 42 through resistor R1 is also coupled with the source of P-channel transistor MP3 which has its drain coupled with node N1, and its gate coupled with the signal PAD_PGATE, and its well coupled with NWELL, in one example.

As FIG. 2 shows, a cascoded inverter structure 50 can be used to protect the devices from over-voltage. This structure can include a pull-up path 52, comprising devices MP1 and MP2, and a pull-down path 54, comprising devices MN1 and MN2. Further, one or more regulated supplies (not shown) can be coupled to the circuit 30 of FIG. 2 to bias one or more particular circuit nodes, such as, for example: PAD-Vt, PAD_PGATE, NWELL, V_25, V_10, and NGATE.

Table I lists examples of values for the circuit 30 of FIG. 2 during normal operations as well as during a hot-plug or live insertion mode, in accordance with one embodiment of the present invention.

TABLE I

Normal and Hot-plug operation modes

| Node | Normal Case | Live Insertion Case |
|---|---|---|
| PAD_PGATE | 1.0 volts | PAD |
| NGATE | 2.5 volts | PAD-2Vt |
| NWELL | VDD | PAD-Vth* |
| V_10 | 1.0 volts | 0 volts |
| V_25 | 2.5 volts | 0 volts |

*Vth is approximately one diode drop.

In the normal mode, the circuit 30 of FIG. 2 works in one example as an inverting buffer with various nodes driven in a manner as shown on Table I to prevent an over-voltage condition for each device. Node V_10 may be approximately 1.0 volt and node V_25 may be approximately 2.5 volts. These signals can be generated using a common resistor divider type of circuit, as one example. The requirements for the signal at node N1 may include that it should be more than about 1.0 volt (or about 2Vt above the ground level). Also, the signal level at node N2 may be maintained below about 2.5 volts, in order to prevent an over-voltage condition. To implement this, transistors MP3 and MN3 can be used. The gates of MP3 and MN3 may be maintained at about 1.0 volts, and about 2.5 volts, respectively, in the normal operating mode, in one example.

Hence, the buffer 30 acts as an inverter during normal operations when VDD is present since transistors MP3, MN3, MP2 and MN1 are on. If the PAD voltage input 42 is high, transistor MN2 turns on (and transistor MP1 turns off) and the output signal INPUT TO CORE 44 goes low. If the PAD voltage input 42 is low, transistor MP1 turns on (and transistor MN2 turns off) and the output signal INPUT TO CORE 44 goes high.

In the live insertion/hot-plug mode, PAD_PGATE may be approximately at the PAD potential and NWELL may be essentially at about PAD-Vd, where Vd can be the cut-in voltage for a diode. This will cause transistor MP3 to turn off. To prevent the MP3 well diode from forward biasing, the well of MP3 is coupled with NWELL. Because of this, there may be no leakage through transistor MP3. As the MP3 drain can reach about the PAD voltage and node N1 can be at about zero potential, MP3 can sustain damage due to over-voltage. To reduce the risk of this, transistor MN4 may be used to force a level of about PAD-2Vt at node N1.

FIGS. 3–5 show examples of circuits 32, 34, 36 that may be used to generate the bias voltage levels shown in Table I for the buffer circuit 30 of FIG. 2, in accordance with an embodiment of the present invention. Of course, any appropriate bias generation circuits known in the art can be used to generate the signals in accordance with Table 1. As will be described with reference to FIGS. 3–5, these circuits 32, 34, 36 can be used to provide signals PAD-Vt, NWELL, PAD_PGATE, and NGATE that may be used for the circuit of FIG. 2. In FIGS. 3–5, the legend VPWR is the same as VDD in FIG. 2, and the legend VGND is the same as VSS in FIG. 2.

In FIG. 3, circuit 32 may include three circuit sections 60, 62, 64, in one example. In FIG. 3, the substrate of the N-channel transistors are coupled with VGND, while the wells of the P-channel transistors are coupled with NWELL, in one example.

In a first section 60 producing signals PAD-Vt, PGATE, and PAD-2Vt, transistors MN11, MN12, MP11, MP12, and MN13 are connected in series, in one example. N-channel transistor MN11 has its gate coupled with the PAD signal through resistor R1 (which may be the same resistor as resistor R1 in FIG. 2), and its drain is coupled with its gate. The source of transistor MN11 provides the signal PAD-Vt (which can be used in FIG. 2) and is coupled with the drain and gate of N-channel transistor MN12 which is coupled to circuit portion 70 shown below in FIG. 5. The source of transistor MN12 is coupled with the source of P-channel transistor MP1 as well as with circuit portion 72 of FIG. 5 below. The gate of transistor MP11 is coupled with signal VPWR, and the drain of transistor MP11 is coupled with the source of P-channel transistor MP12. The source of transistor MP12 produces the signal PAD-2Vt, while the gate of transistor MP12 is coupled with the VPWR signal, in one example. The drain of transistor MP12 is coupled with the drain of N-channel transistor MN13 to produce the PGATE signal, in one example. N-channel transistor MN13 has its gate driven by signal V_25, and its source coupled with signal V_10.

In a second section 62 for producing bias signal NWELL (which can be used in FIG. 2), P-channel transistor MP13 receives at its gate the PGATE signal, and has its source coupled with VPWR, and its drain coupled with the PAD-2Vt signal. The well of transistor MP13 is coupled with the NWELL signal, in one example. P-channel transistor MP15 has its source coupled with the drain of transistor MP13, and its drain and well connected together and coupled with the NWELL signal.

In a third section 64 for producing signal PAD_PGATE (which can be used in FIG. 2), P-channel transistor MP14 has its source coupled with the drain of transistor MN11 which is also coupled to the gate of transistor MP14 through resistor R2. The drain of transistor MP14 is coupled with the source of P-channel transistor MP16. P-channel transistor MP11 has its gate coupled with a PGATE signal, and its source coupled with the drain of transistor MP14, and its drain coupled with the gate of transistor MP15 which is coupled with the PAD_PGATE signal.

N-channel transistors MN14 and MN15 are connected in parallel, with transistor MN14 having its gate and drain coupled with VPWR, while the gate and drain of transistor MN15 are coupled with the signal PAD-Vt. The source of transistor MN14 is coupled with the source of transistor MN15, which is coupled with the drain and gate of transistor MN16. The source of transistor MN16 is coupled with the gate and source of N-channel transistor MN17, which has its drain coupled with VPWR.

N-channel transistor MN18 has its source coupled with the gate of transistor MN17, and its gate and drain coupled with the gate of transistor MP14 and the PAD signal through the series combination of resistors R1 and R2. In one example, resistor R2 may be 20 k-ohms to 30 k-ohms.

N-channel transistor MN19 has its gate coupled with the sources of transistors MN14 and MN15 and the gate of transistor MN16, and the source of transistor MN19 produces the PAD_PGATE signal that drives the gate of transistor MP15. The drain of transistor MN19 is coupled with the source of N-channel transistor MN20. Transistor MN20 has its gate coupled with signal V_25, and its drain coupled with the signal V_10.

In FIG. 4, one example of a circuit 34 for generating a signal NGATE (which can be used in FIG. 2) is illustrated in accordance with an embodiment of the present invention. The substrates of the N-channel transistors are coupled with VGND, while the wells of the P-channel transistors are coupled with NWELL, in one example.

In FIG. 4, transistors MN22, MP17, and MN23 are coupled in series. The drain and gate of N-channel transistor MN22 are coupled with the PAD-Vt signal of FIG. 3, while the source of transistor MN22 generates the NGATE signal which is coupled with the drain of P-channel transistor MP17. The gate of transistor MP17 is coupled with the PGATE signal, while the source of transistor MP17 is coupled with the source of N-channel transistor MN23. The gate of transistor MN23 is coupled with the VWPR signal, while the drain is coupled with the V_25 signal.

The circuit portions 70 and 72 of FIG. 3 are shown respectively in circuit 36 of FIG. 5. In FIG. 5, the substrates of the N-channel transistors are coupled with VGND, while the wells of the P-channel transistors are coupled with NWELL, in one example.

In FIG. 5, circuit portion 72 has two N-channel transistors connected in series. Transistor MN25 has its source coupled with the source of transistor MP11 of FIG. 3, and its drain and gate coupled together with the source of transistor MN26. Transistor MN26 has its gate and drain coupled together with the VDD signal, in one example.

In FIG. 5, circuit portion 70 has transistors MP18, MP19, MN28, and MN27. In one example, P-channel transistor MP18 has its source coupled with the drain of transistor MN12 of FIG. 3, and the gate of transistor MP18 in FIG. 5 is coupled with the PAD_RES signal, wherein PAD_RES is the node after resistor R1 in FIG. 3. The drain of transistor MP18 is coupled with the source of P-channel transistor MP19, which has its gate coupled with the PGATE signal. The gate and drain of N-channel transistor MN28 are coupled with the drain of transistor MP19. The source of transistor MN28 is coupled with the drain and gate of transistor MN27, and the source of transistor MN27 is coupled with VGND.

Table II lists examples of values for various voltage signals in the circuit of FIGS. 3–5 during normal operations as well as during a hot-plug or live insertion mode, in accordance with one embodiment of the present invention.

TABLE II

| Normal and Hot-plug operation modes | | |
|---|---|---|
| Node | Normal Case | Live Insertion Case |
| NWELL | VDD | PAD-Vth* |
| PGATE | 1.0 volts | PAD-2Vt |
| PAD_PGATE | 1.0 volts | PAD |
| PAD-2Vt | VDD | PAD-2Vt |
| NGATE | 2.5 volts | PAD-2Vt |
| V_10 | 1.0 volts | 0 volts |
| V_25 | 2.5 volts | 0 volts |

*Vth is approximately one diode drop.

In FIGS. 3–5, NWELL is generated such that there is no current path from VPWR to NWELL in the live-insertion case, and in the normal mode, there is no current path from PAD to VPWR.

In normal condition, transistors MP11 and MP12 of FIG. 3 will be OFF and PGATE will charge to V_10 (V_10< (V_10-Vt)). This in turn will turn transistor MP13 of FIG. 3 ON and PAD-2Vt will reach VDD value. In this condition, node 82 of FIG. 3 should not be less than 2Vt otherwise transistor MP11 of FIG. 3 will face over-voltage. Therefore, the circuit of FIG. 5 is used to keep node 82 of FIG. 3 at least 2Vt above ground level.

In hot-plug condition, VPWR is 0 volts so that V_10 and V_25 will also be 0 volts. Hence, the voltage of node 80 of FIG. 3 will charge to PAD-Vt and node 82 of FIG. 3 will charge to PAD-2Vt. Hence, PAD-Vt and PAD-2Vt are generated.

In section 62 of FIG. 3, the NWELL bias circuit is provided. The NWELL signal should be VDD in normal operating condition, and should be biased from PAD during a hot-plug condition. In normal conditions, PGATE is V_10 and PAD_PGATE is also V_10 (from circuit section 64 of FIG. 3, since ((VDD-Vt) and (V_25-Vt)>V_10). Therefore, transistors MP13 and MP15 will be on, and NWELL will charge to VDD potential.

In a hot-plug condition, the voltage drop across resistor R2 in FIG. 3 will cause transistor MP14 to turn on. Transistor MP16 will also turn on because PGATE is PAD-2Vt under this condition. Therefore, PAD_PGATE will turn off transistor MP15. But the NWELL signal will be charged to PAD-Vth (one diode drop) by transistor MP3 (diode leakage) of FIG. 2.

FIG. 4 generates an NGATE signal for NMOS transistor MN3 in FIG. 2. In normal conditions, NGATE will be V_25 and in hot-plug condition NGATE will be PAD-2Vt. Capacitance may be added at this node to avoid excessive switching.

Node 80 in FIG. 3 does not have any discharge path, except as provided by the circuit 36 of FIG. 5. In normal conditions, if PAD is VDD, node 80 will charge to PAD-Vt, and if PAD goes to 0 volts, transistor MN11 of FIG. 3 would be exposed to over-voltage; however, through the use of the circuit of FIG. 5, if PAD is low, the circuit of FIG. 5 will turn on and discharge node 80 to 2Vt level.

FIG. 6 illustrates one possible use of an embodiment of the present invention. In FIG. 6, an integrated circuit 40 includes a core 46 and a plurality of pads 42 for receiving or transmitting external signals. One or more I/O buffers 30 can be made using embodiments of the present invention for electrically coupling a portion of said core to one or more pads. Embodiments of the present invention can be used in a variety of circuits where buffers may be used, such as in non-volatile memory circuits, programmable logic devices, semiconductors, microprocessors or micro-controllers, logic or programmable logic devices, clock circuits, or the like.

It is understood that while the various aspects of the particular embodiment set forth herein has been described in detail, the present invention could be subject to various changes, substitutions, and alterations without departing from the spirit and scope of the invention. As but a few examples, the particular voltage levels described herein could be changed to different voltage levels, depending on the particular application and processing technologies involved. For example, V_25 may correspond to 2.2 volts, 2.0 volts, 1.8 volts, 1.5 volts, or other voltage, depending on the application and processing technologies involved. Similarly, V_10 may correspond to 1.5 volts, 1.2 volts, 0.8 volts, 0.6 volts, or other voltage, depending on the application and processing technologies involved. In addition, the transistor Vt (threshold voltages) may be essentially any suitable voltage difference. In addition, other types of switching and voltage shifting devices, such as bipolar or other types of transistors may be used to implement an embodiment of this invention.

While the methods disclosed herein have been described and shown with reference to particular operations performed in a particular order, it will be understood that these operations may be combined, sub-divided, or re-ordered to form equivalent methods without departing from the teachings of the present invention. Accordingly, unless specifically indicated herein, the order and grouping of the operations is not a limitation of the present invention.

While the invention has been particularly shown and described with reference to embodiments thereof, it will be understood by those skilled in the art that various other changes in the form and details may be made without departing from the spirit and scope of the invention.

What is claimed is:

1. An input buffer circuit having an input and a buffer output, said input buffer operable in a normal mode and a hot-plug mode, comprising:
    a pull-up path coupled between a first circuit supply and the buffer output;
    a pull-down path coupled between the buffer output and a ground reference voltage;
    a first transistor coupled between the input and the pull-up path to activate the pull-up path;
    a second transistor coupled between the input and the pull-down path to activate the pull-down path; and
    a third transistor for protecting the pull-up path from over-voltage;
    wherein the input buffer circuit is configured to prevent an over-voltage condition on each of the plurality of transistors and the input buffer circuit is configured to allow a hot-plug operation.

2. The input buffer circuit of claim 1, further comprising:
    a first bias voltage for biasing the first transistor; and
    a second bias voltage for biasing the second transistor.

3. An input buffer circuit having an input and a buffer output, said input buffer operable in a normal mode and a hot-plug mode, comprising:
    a pull-up path coupled between a first circuit supply and the buffer output;
    a pull-down path coupled between the buffer output and a ground reference voltage;
    a first transistor coupled between the input and the pull-up path to activate the pull-up path;
    a second transistor coupled between the input and the pull-down path to activate the pull-down path; and
    a third transistor for protecting the pull-up path from over-voltage
    wherein the pull-up path includes:
        a first reference voltage; and
        a first pair of transistors including a first and second pull-up transistor coupled in series, said first pull-up transistor having a gate coupled with the first transistor and said gate biased by the third transistor and said second pull-up transistor having a gate biased by the first reference voltage.

4. The input buffer circuit of claim 3, wherein the pull-down path includes:
    a second reference voltage; and
    a second pair of transistors including a first and second pull-down transistor coupled in series, said first pull-down transistor having a gate coupled with the second transistor and said second pull-down transistor having a gate biased by the second reference voltage.

5. The input buffer circuit of claim 4, wherein the first reference voltage is approximately 1.0 volts, and the second reference voltage is approximately 2.5 volts.

6. An input buffer circuit having an input and a buffer output, said input buffer operable in a normal mode and a hot-plug mode, comprising:
    a pull-up path coupled between a first circuit supply and the buffer output;
    a pull-down path coupled between the buffer output and a ground reference voltage;
    a first transistor coupled between the input and the pull-up path to activate the pull-up path;
    a second transistor coupled between the input and the pull-down path to activate the pull-down path;
    a third transistor for protecting the pull-up path from over-voltage;
    a first bias voltage for biasing the first transistor; and
    a second bias voltage for biasing the second transistor;
    wherein the first bias voltage is approximately 1.0 volts during the normal mode and is approximately the input minus two diode drops during the hot-plug mode.

7. An input buffer circuit having an input and a buffer output, said input buffer operable in a normal mode and a hot-plug mode, comprising:
    a pull-up path coupled between a first circuit supply and the buffer output;
    a pull-down path coupled between the buffer output and a ground reference voltage;
    a first transistor coupled between the input and the pull-up path to activate the pull-up path;
    a second transistor coupled between the input and the pull-down path to activate the pull-down path;
    a third transistor for protecting the pull-up path from over-voltage;
    a first bias voltage for biasing the first transistor; and
    a second bias voltage for biasing the second transistor;
    wherein the second bias voltage is approximately 2.5 volts during the normal mode and is approximately the input minus two diode drops during the hot-plug mode.

* * * * *